(12) United States Patent
Fouquet-Lapar

(10) Patent No.: US 7,478,285 B2
(45) Date of Patent: Jan. 13, 2009

(54) GENERATION AND USE OF SYSTEM LEVEL DEFECT TABLES FOR MAIN MEMORY

(75) Inventor: Matthias Fouquet-Lapar, Chevreuse (FR)

(73) Assignee: Silicon Graphics, Inc., Mountain View, CA (US)

( * ) Notice: Subject to any disclaimer, the term of this patent is extended or adjusted under 35 U.S.C. 154(b) by 441 days.

(21) Appl. No.: 11/323,029

(22) Filed: Dec. 30, 2005

(65) Prior Publication Data

US 2007/0174718 A1    Jul. 26, 2007

(51) Int. Cl.
*G06F 11/00* (2006.01)
(52) U.S. Cl. .................. 714/42; 714/6; 714/7; 714/8; 365/201; 365/222
(58) Field of Classification Search .............. 714/42
See application file for complete search history.

(56) References Cited

U.S. PATENT DOCUMENTS

| 6,173,382 | B1* | 1/2001 | Dell et al. .................... 711/170 |
| 6,496,945 | B2* | 12/2002 | Cepulis et al. ................ 714/25 |
| 2003/0021170 | A1* | 1/2003 | Perner ......................... 365/201 |
| 2004/0034825 | A1* | 2/2004 | Jeddeloh ..................... 714/733 |
| 2006/0069856 | A1* | 3/2006 | Klein .......................... 711/106 |
| 2007/0030746 | A1* | 2/2007 | Best et al. ................... 365/222 |

* cited by examiner

*Primary Examiner*—Emerson C Puente
(74) *Attorney, Agent, or Firm*—Patterson & Sheridan, L.L.P.

(57) ABSTRACT

Methods and apparatus for maintaining and utilizing system memory defect tables that store information identifying defective memory locations in memory modules. For some embodiments, the defect tables may be utilized to identify and re-map defective memory locations to non-defective replacement (spare) memory locations as an alternative to replacing an entire memory module. For some embodiments, some portion of the overall capacity of the memory module may be allocated for such replacement.

18 Claims, 4 Drawing Sheets

GENERATION AND USE OF SYSTEM LEVEL DEFECT TABLES FOR MAIN MEMORY

BACKGROUND OF THE INVENTION

1. Field of the Invention

Embodiments of the present invention generally relate to techniques for increasing the overall reliability of memory systems that utilize modular memory modules.

2. Description of the Related Art

Computer system performance can be increased by increasing computing power, for example, by utilizing more powerful processors or a larger number of processors to form a multi-processor system. It is well established, however, that increasing memory in computing systems can often have a greater effect on overall system performance than increasing computing power. This result holds true from personal computers (PCs) to massively parallel supercomputers.

High performance computing platforms, such as the Altix systems available from Silicon Graphics, Inc. may include several tera-bytes (TBs) of memory. To provide such a large amount of memory, such configurations may include many thousands of modular memory modules, such as dual inline memory modules (DIMMs). Unfortunately, with such a large number of modules in use (each having a number of memory chips), at least some amount of memory failures can be expected. While factory testing at the device (IC) level can catch many defects and, in some cases, replace defective cells with redundant cells (e.g., via fusing), some defects may develop over time after factory testing.

In conventional systems, a zero defect tolerance is typically employed. If a memory failure is detected, the entire module will be replaced, even if the failure is limited to a relatively small portion of the module. Replacing modules in this manner is inefficient in a number of ways, in addition to the possible interruption of computing and loss of data. On the one hand, the replacement may be performed by repair personnel of the system vendor at substantial cost to the vendor. On the other hand, the replacement may be performed by dedicated personnel of the customer, at substantial cost to the customer.

A costly solution to increase fault tolerance is through redundancy. For example, some systems may utilize some type of system memory mirroring whereby the same data is stored in multiple "mirrored" memory devices. However, this solution can be cost prohibitive, particularly as the overall memory space increases. Another alternative is to simply avoid allocating an entire defective device or DIMM from allocation. However, this approach may significantly impact performance by reducing the available memory by an entire device or DIMM, regardless of the amount of memory locations found to be defective.

Accordingly, what is needed is a technique to increase the overall reliability of memory systems that utilize modular memory modules.

SUMMARY OF THE INVENTION

Embodiments of the present invention provide techniques for increasing the overall reliability of memory systems that utilize modular memory modules.

One embodiment provides a method for maintaining and utilizing memory defect tables in a computing system. The memory defect tables may store entries indicating defective memory locations of memory modules (such as DIMMs) which may then, at the system level, be mapped to non-defective memory locations. The memory defect tables may be maintained across reset (e.g., power-up) cycles of the computing system.

Another embodiment provides a computing system configured to maintain and utilize memory defect tables. The memory defect tables may store entries indicating defective memory locations of memory modules (such as DIMMs) which may then, at the system level, be mapped to non-defective memory locations. The memory defect tables may be maintained across reset cycles of the computing system.

Another embodiment provides a computer readable medium containing a program which, when executed by a processor of a computing system, performs operations to maintain and utilizes memory defect tables. The operations may include detecting defective memory locations of memory modules and storing entries in the defect tables indicating the defective memory locations. The operations may also include mapping the defective memory locations to non-defective memory locations. The operations may also include accessing the memory defect tables upon power up, or other reset, and allocating memory to avoid defective locations identified in the tables.

Another embodiment provides a memory module comprising a plurality of volatile memory devices and at least one non-volatile memory device. A defect table identifying defective locations within the volatile memory devices is contained in the non-volatile memory device. For some embodiments, the non-volatile memory device may also include information for mapping the defective memory locations to non-defective memory locations.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide methods and apparatus for maintaining and utilizing system memory defect tables that store information identifying defective memory locations in memory modules. For some embodiments, the defect tables may be utilized to identify and re-map defective memory locations to non-defective replacement (spare) memory locations as an alternative to replacing an entire memory module. For some embodiments, some portion of the overall capacity of the memory module may be allocated for such replacement. As a result, memory modules may be made more fault-tolerant and systems more reliable. Further, this increased fault-tolerance may significantly reduce service requirements (e.g., repair/replacement) and overall operating cost to the owner and/or vendor.

Embodiments of the present invention will be described below with reference to defect table to identify defective memory locations in dual inline memory modules (DIMMs). However, those skilled in the art will recognize that embodiments of the invention may also be used to advantage to identify defective memory locations in any other type of memory module or arrangement of memory devices, including cache memory structures. Thus, reference to DIMMs should be understood as a particular, but not limiting, example of a type of memory module.

Further, while embodiments will be described with reference to operations performed by executing code (e.g., by a processor or CPU), it may also be possible to perform similar operations with dedicated or modified hardware. Further, those skilled in the art will recognize that the techniques described herein may be used to advantage in any type of system in which multiple memory devices are utilized.

An Exemplary System

Figure 1:
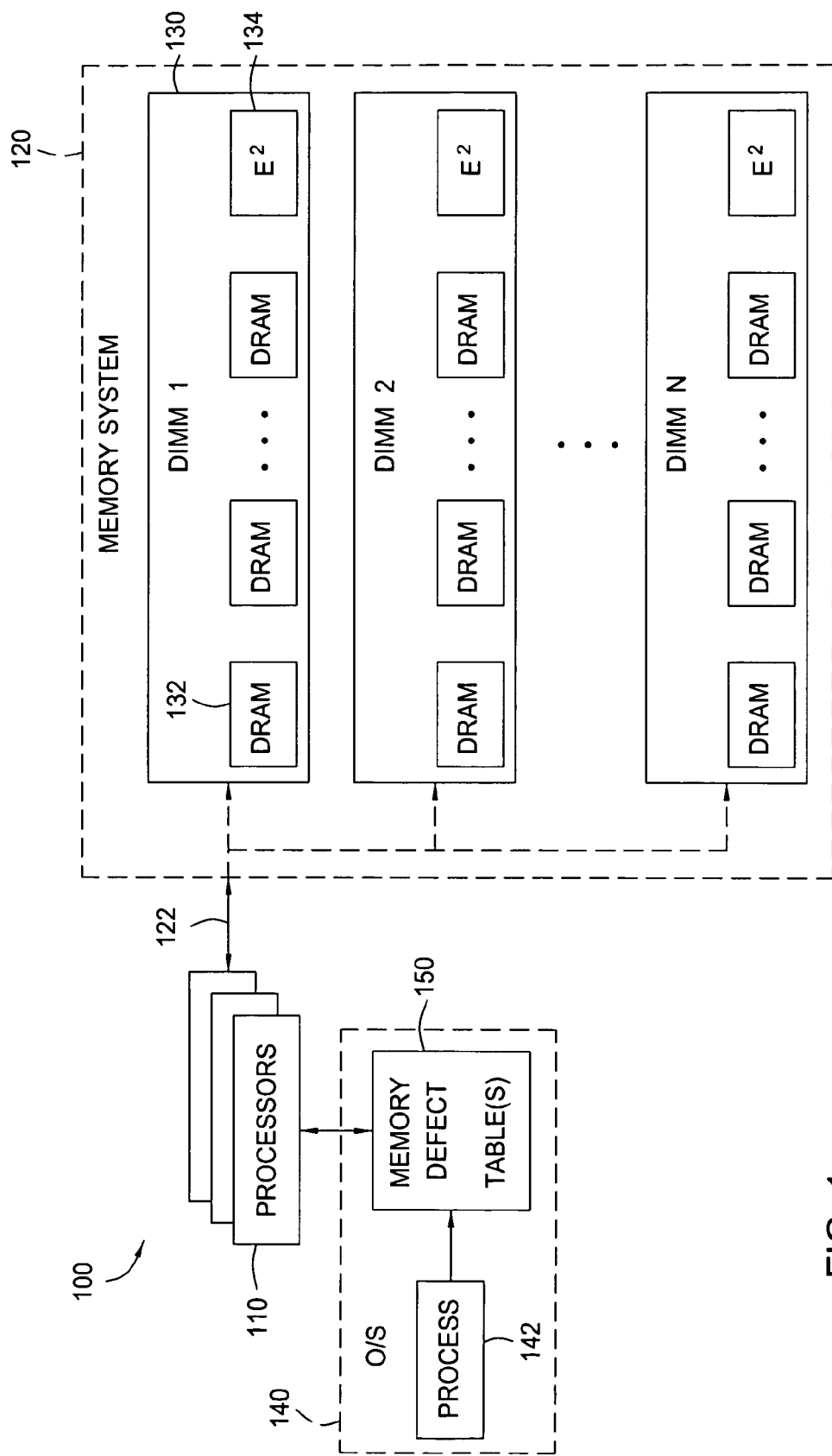
FIG. 1 illustrates an exemplary system in which embodiments of the present invention may be utilized.

FIG. 1 illustrates an exemplary computing system 100 including one or more processors 110 coupled to a memory system 120 via an interface 122. While not shown, the system 100 may also include any other suitable components, such as graphics processor units (GPUs), network interface modules, or any other type of input/output (I/O) interface. The interface 122 may include any suitable type of bus (e.g., a front side bus) and corresponding components to allow the processors 110 to communicate with the memory system 120 and with each other.

As illustrated, the memory system 120 may include a plurality of memory modules, illustratively shown as DIMMs 130. As previously described, the number of DIMMs 130 may grow quite large, for example, into the thousands for large scale memory systems of several terabytes (TBs). Each DIMM 130 may include a plurality of volatile memory devices, illustratively shown as dynamic random access memory (DRAM) devices 132. As previously described, as the number of DIMMs 130 increases, thereby increasing the number of DRAM devices 132, the likelihood of a defect developing in a memory location over time increases.

In an effort to monitor the defective memory locations, one or more memory defect tables 150 may be maintained to store defective memory locations. For some embodiments, identification of a defective block or page within a particular DIMM and/or DRAM device 132 may be stored (e.g., regardless of the number of bits that failed). Contents of the defect tables 150 may be maintained across reset cycles, for example, by storing the defect tables 150 in non-volatile memory. As will be described in greater detail below, for some embodiments, defect tables 150 may be stored on the DIMMs, for example in non-volatile memory, such as EEPROMs 134, allowing defect information to travel with the DIMMs.

Defects may be detected via any suitable means, including conventional error checking algorithms utilizing checksums, error correction codes (ECC) bits, and the like. Regardless, upon detection of a defective memory location, an entry may be made in the defect table 150 and the defective memory location may be remapped to a different (non-defective) location. In some cases, system level software, such as a process 142 running as part of an operating system (O/S) 140 may detect defective memory locations, maintain, and/or utilize the defect table 150, by performing operations described herein.

For some embodiments, a predetermined amount of memory locations in the DIMM may be allocated and used to replace defective memory locations when detected. In some cases, replacement may be allowed in specified minimal sizes. For example, for some embodiments, entire pages of memory may need to be replaced, regardless of the number of bits found to be defective in that page.

For some embodiments, some number of spare pages may be allocated and used for replacement by remapping defective memory locations. As an example, for a DIMM with 1 GB total capacity, if n pages were allocated for replacement, the total usable capacity may be 1 GB−n*page_size. The reduction in usable capacity may be acceptable given the offsetting benefit in increased fault tolerance and reduced service/repair. Further, in certain systems, such as cache-coherent non-uniform memory access (ccNUMA) systems, some portion of memory is dedicated to overhead, such as maintaining cache coherency, such that a relatively small (e.g., 1-2%) reduction in overall usable capacity would be transparent to the user.

Figure 2:
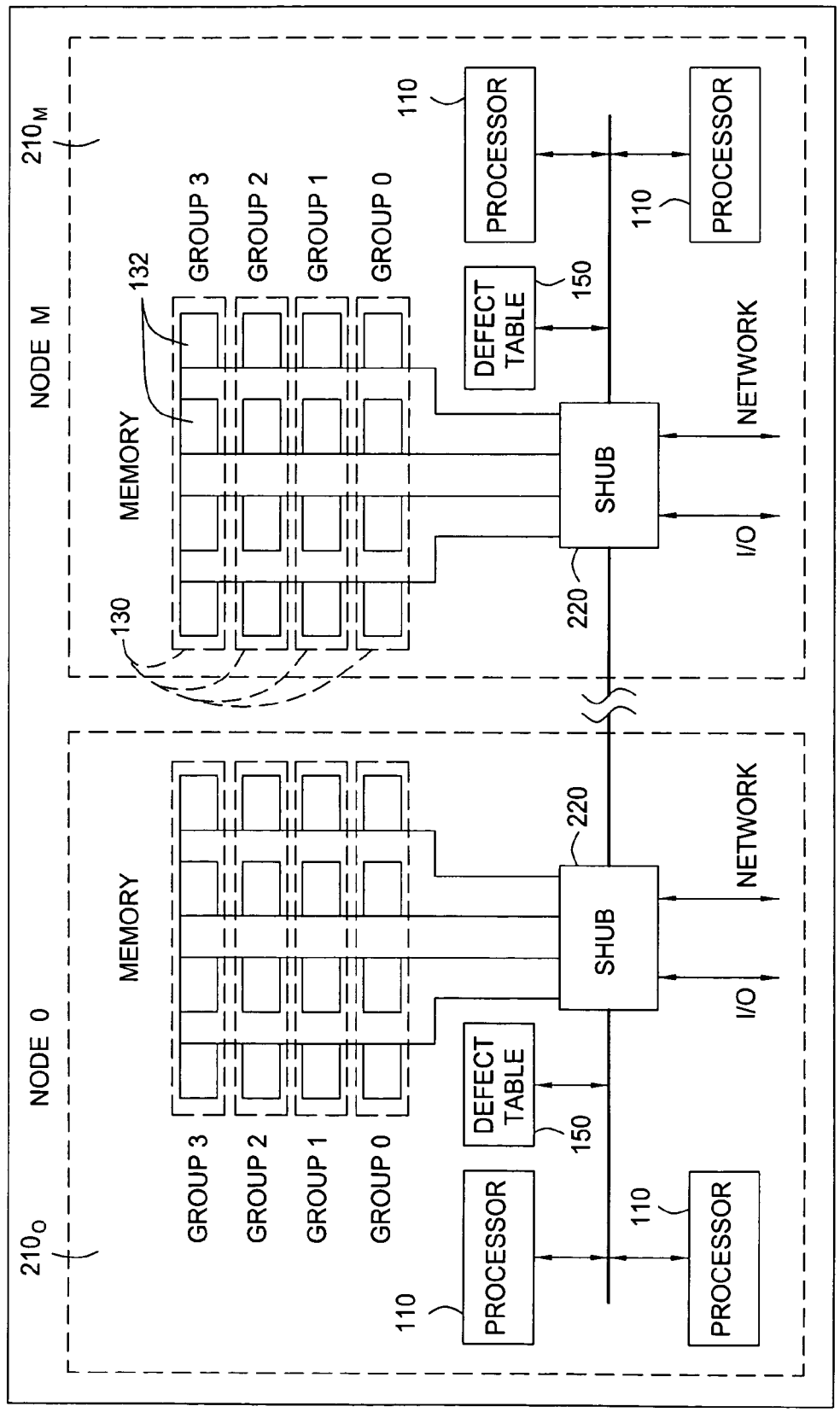
FIG. 2 illustrates an exemplary logical arrangement in accordance with embodiments of the present invention.

For some embodiments, a single defect table 150 may be used to store defective locations for multiple DIMMs 130. For other embodiments, a different defect table 150 may be maintained for each DIMM 130. As illustrated in FIG. 2, for some embodiments, processors and memory may be logically partitioned into a plurality of nodes 210 (as shown $210_0$-$210_M$). Each node 210 may include one or more processors 110 that access DIMMs 130 via an interface hub (SHUB 220). As illustrated, the collective memory of each node 210 may be considered shared memory and accessible by processors 110 on each node. As illustrated, in such configurations, each node 210 may maintain one or more defect tables 150 to store information regarding defective memory locations for their respective DIMMs 130.

Exemplary Operations

Figure 3A:
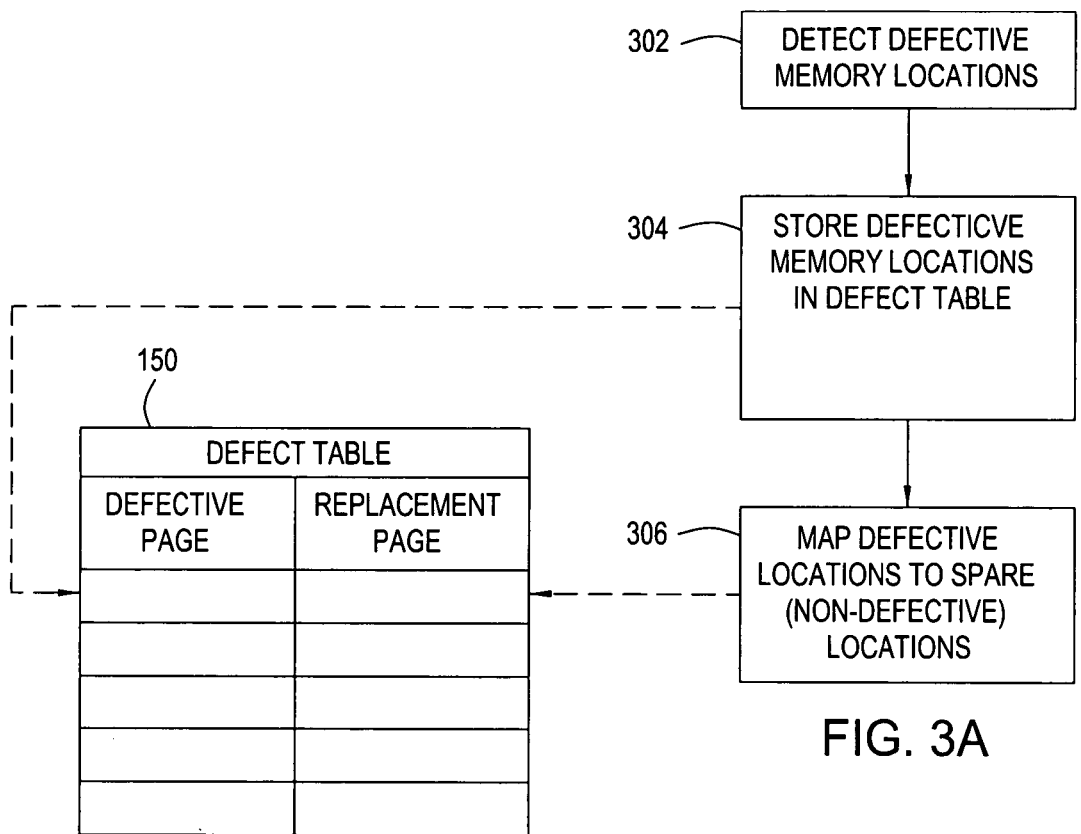
FIGS. 3A-3B illustrate exemplary operations for maintaining and utilizing a system memory defect table, in accordance with one embodiment of the present invention.

FIG. 3A illustrates exemplary operations for maintaining system memory defect table, in accordance with one embodiment of the present invention. The operations may be performed, for example, as operating system code, or application code. The operations begin, at step 302, by detecting defective memory locations. At step 304, the defective memory locations are stored in the memory defect table 150, which may be maintained across reset cycles. These defective memory locations may be subsequently avoided, for example, by mapping the defective locations to spare (non-defective) locations, at step 306.

As illustrated, for some embodiments, the defect table 150 may include entries that include a defective location and a corresponding replacement location. For example, the defective location may be identified by page, DIMM, and/or device. Similarly, the replacement location (to which the defective location is mapped) may be identified by page, DIMM, and/or device.

Figure 3B:
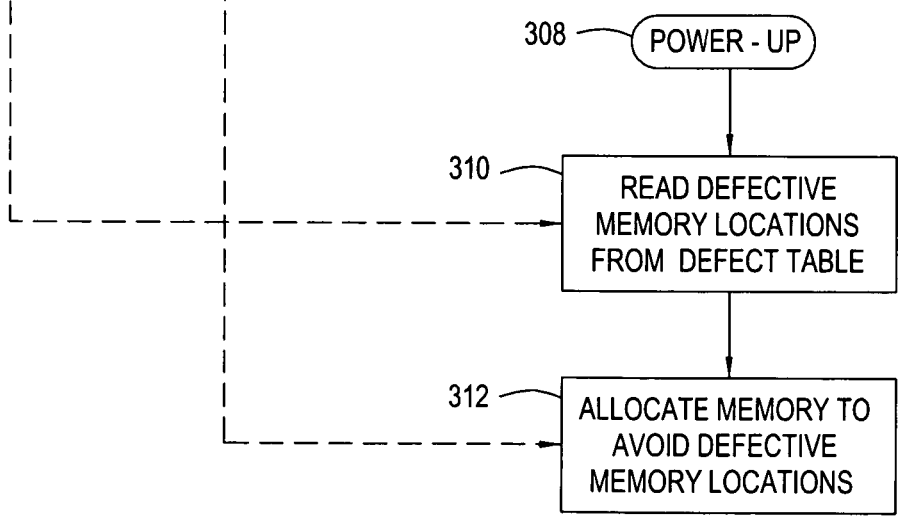

Referring to FIG. 3B, by maintaining the defect table 150 across reset cycles, the defect table 150 may be utilized upon a subsequent reset to avoid allocating defective memory locations. For example, upon a subsequent reset, at step 308, defective memory locations may be read from the defect memory table 150, at step 310. These memory locations may be avoided during allocation, at step 312, for example, by mapping the defective locations to replacement locations, which may also identified in the defect table 150.

Defective memory locations may be mapped to replacement memory locations, for example, by manipulating virtual-to-physical address translation. For some embodiments, page table entries may be generated that translate internal virtual addresses to the physical addresses of the replacement memory locations rather than the defective memory locations. For some embodiments, defective memory locations on one DIMM may be replaced by replacement memory locations on another DIMM.

In any case, by avoiding the allocation of defective memory locations, it may be possible to avoid replacing entire DIMMs 130 and replace defective memory locations in a manner that is transparent to a user. As a result, a much greater utilization of memory resources may be achieved, particularly if only a small percentage of memory locations exhibit defects (e.g., some limited number of pages encounter defective cells). For some embodiments, however, an entire DIMM may be effectively removed (e.g., by de-allocation) if the total number of defective locations exceeds some threshold number or percentage. In other words, the occurrence of a certain number of defective locations may be a good predictor of pending device failure.

Figure 4:
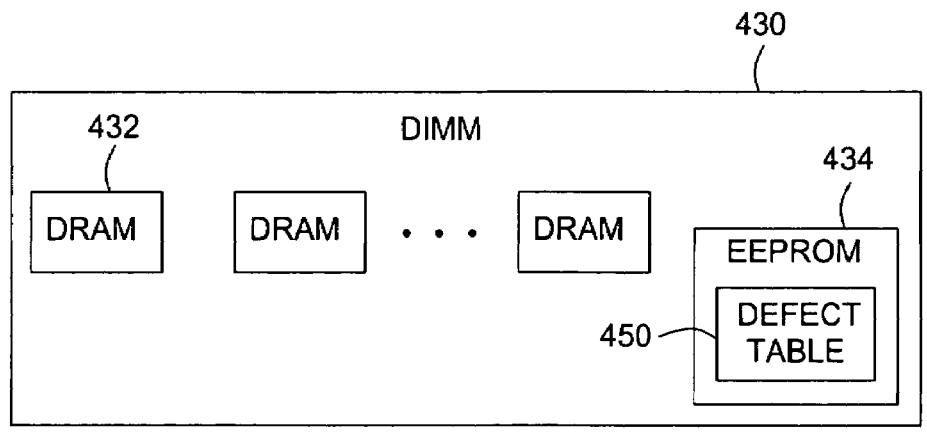
FIG. 4 illustrates exemplary operations for identifying defective memory locations, in accordance with one embodiment of the present invention.
Figure 5:
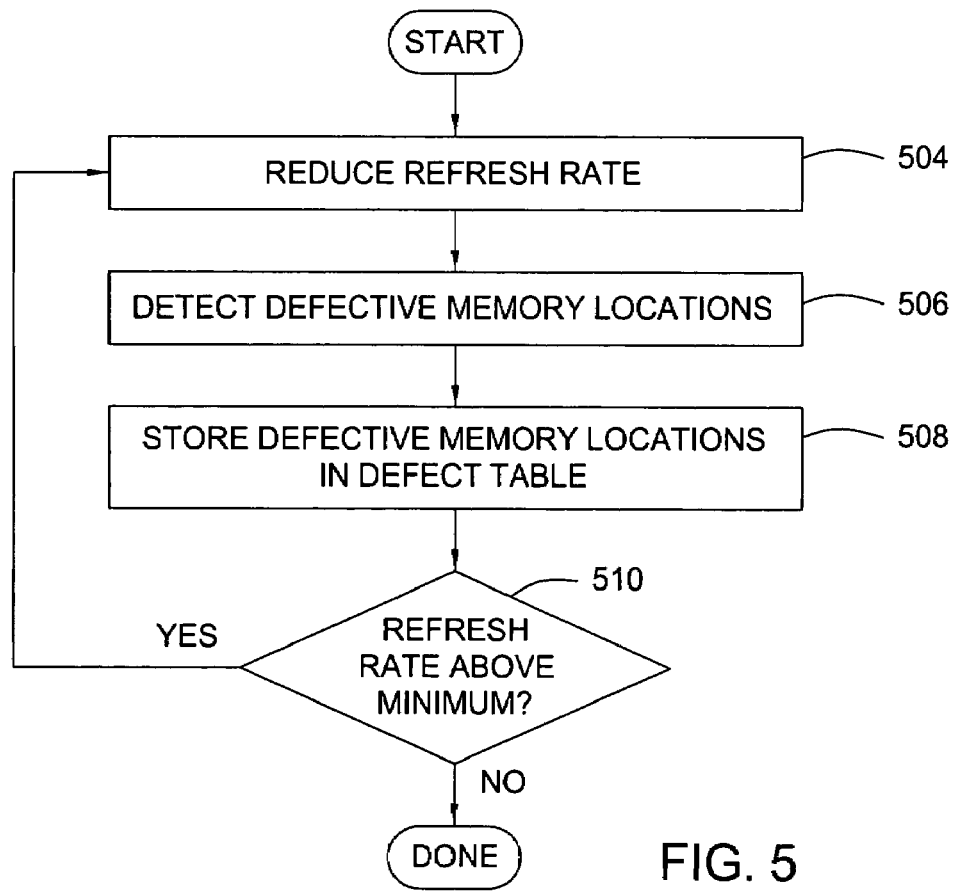
FIG. 5 illustrates an exemplary memory module, in accordance with another embodiment of the present invention.

As illustrated in FIG. 4, for some embodiments, defective locations of DRAM devices 432 may be stored on a DIMM 430. For example, one or more defect tables 450 may be stored in non-volatile memory, such as a EEPROM 434. DIMMs typically contain a EEPROM to comply with the JEDEC Serial Present Detect (SPD) standard. According to this standard, DIMM manufactures may store necessary operating parameters (e.g., describing the DRAM devices, operating parameters, etc.), for use by the OS during system reset in configuring memory controllers. If the size of these EEPROMs were sufficient, defect tables 450 could be stored with this SPD data. In fact, it may be beneficial that the storage and use of such defect tables may be incorporated into such a standard.

Margin Testing Using Extended Refresh Cycles

Further, in some cases, some memory cells may be more prone to failure, for example, due to marginal storage capacitance in DRAM cells. For some embodiments, such marginal locations may be proactively detected to avoid errors and increase reliability. As an example, FIG. 4 illustrates a technique whereby extended refresh cycles may be utilized for identifying weak DRAM memory cells. Such operations may be performed periodically, or upon reset, as part of an initialization procedure by the operating system. For some embodiments, to prevent uncorrectable errors occurring during testing with extended refresh cycles, user data may be offloaded from a DIMM under test (e.g., to another DIMM or a disk drive).

In any case, the operations may begin, for example, by setting an initial refresh rate, which may be the same as that typically utilized during normal operation. As is well known, rows of memory cells may be refreshed automatically by issuing a refresh command. DRAM devices may internally increment a row address such that a new row (or set of rows in different banks) is refreshed with each issued command. The rate at which these commands are issued during normal operation is controlled to ensure each row is refreshed within a defined retention time specified by the device manufacturer.

However, to test for marginal cells, this rate may be incrementally decreased at step 504 (e.g., by increasing the interval between refresh commands) until each row is not refreshed within the specified retention time. At step 506, memory locations exhibiting defects at the lower refresh rate are detected. This detection may be performed in any suitable manner, such as preloading the memory devices with known data, reading the data back, and comparing the data read to the known data. A mismatch indicated a memory cell that fails to maintain data at the lowered refresh rate. Such defective (marginal) memory locations may be stored in a defect table, at step 508.

As illustrated, the operations may repeat, with successively reduced refresh rates, until the refresh rate reaches a predetermined minimum amount (which may be well below the device specified operating range), as determined at step 510. By storing these defective locations in the defect table, these locations may be avoided during allocation, as described above. For some embodiments, memory defect tables may be populated with both marginal locations detected during testing with extended refresh periods and defective locations detected during normal operation.

CONCLUSION

By generating and maintaining system memory defect tables memory module reliability may be significantly increased. As a result, the number of service/repair operations and overall operating costs of systems utilizing memory modules may be reduced accordingly.

While the foregoing is directed to embodiments of the present invention, other and further embodiments of the invention may be devised without departing from the basic scope thereof, and the scope thereof is determined by the claims that follow.

What is claimed is:

1. A method for accessing system memory having one or more memory modules, comprising:
   detecting defective memory locations of the memory modules;
   storing information identifying the defective memory locations in one or more system memory defect tables; and
   mapping the defective memory locations identified in the system memory defect tables to replacement memory locations, wherein the step of detecting comprises:
   reducing a refresh rate for refreshing rows of memory cells below an operational refresh rate specified by a manufacture of the memory modules;
   identifying as marginal, memory locations of the memory modules having memory cells that fail to maintain data at the reduced refresh rate; and
   storing information identifying the marginal memory locations in the system memory defect tables.

2. The method of claim 1, further comprising maintaining the information in the system memory defect tables across reset cycles.

3. The method of claim 2, wherein maintaining the information in the system memory defect tables across reset cycles comprises storing the system memory defect tables in non-volatile memory.

4. The method of claim 3, wherein storing the system memory defect tables in non-volatile memory comprises storing the system memory defect tables in non-volatile memory located on the memory modules.

5. The method of claim 1, wherein the storing and mapping are performed by operating system code.

6. The method of claim 1, further comprising, avoiding use of a memory module if the total number of defective locations detected thereon exceeds a predetermined threshold amount.

7. The method of claim 1, wherein mapping the defective memory locations identified in the system memory defect tables to replacement memory locations comprises generating page table entries that map virtual addresses to physical addresses of the replacement memory locations.

8. A method for identifying marginal dynamic memory cells in one or more memory modules of system memory, comprising:
   a) reducing a refresh rate for refreshing rows of memory cells in the memory cells to a level below an operational refresh rate specified by a manufacturer of the memory modules;
   b) identifying as marginal, memory locations of the memory modules having memory cells that fail to maintain data at the reduced refresh rate;
   c) storing information identifying the marginal memory locations in one or more system memory defect tables; and
   d) mapping the marginal memory locations to replacement memory locations.

9. The method of claim 8, comprising:
   repeating the operations of a) and b) to incrementally reduce the refresh rate and detecting marginal memory locations at incrementally reduced refresh rates.

10. The method of claim 8, wherein the operations a)-d) are performed by an operating system after a system reset.

11. The method of claim 8, further comprising maintaining information in the system memory defect tables across reset cycles.

12. A system, comprising:
   one or more processing devices;
   system memory addressable by the processing devices, the system memory including one or more memory modules;
   one or more system memory defect tables; and
   a component executable by one or more of the processing devices to detect defective memory locations of the memory modules, store information identifying the defective memory locations in one or more system memory defect tables, and map the defective memory locations identified in the system memory defect tables to replacement memory locations, the component being configured to identify memory locations as defective by reducing a refresh rate of the memory modules and storing information identifying defective memory locations having cells unable to maintain data at reduced refresh rates in the system memory defect tables including reducing the refresh rate to a level below an operational refresh rate specified by a manufacturer of the memory modules.

13. The system of claim 12, wherein information in the system memory defect tables is maintained across reset cycles of the system.

14. The system of claim 12, wherein the system memory defect tables are stored in non-volatile memory.

15. The system of claim 14, wherein the system memory defect tables are stored in non-volatile memory located on the memory modules.

16. The system of claim 15, wherein the system memory defect tables are stored in non-volatile memory located on the memory modules that are also used for serial presence detect (SPD) purposes.

17. The system of claim 12, wherein the component is configured to map the defective memory locations identified in the system memory defect tables to replacement memory locations by generating page table entries that map virtual addresses to physical addresses of the replacement memory locations.

18. The system of claim 12, wherein the component is configured to map defective memory locations of one memory module to replacement memory locations of another memory module.

* * * * *